(12) United States Patent
Tateishi et al.

(10) Patent No.: US 8,299,588 B1
(45) Date of Patent: Oct. 30, 2012

(54) STRUCTURE AND METHOD FOR UNIFORM CURRENT DISTRIBUTION IN POWER SUPPLY MODULE

(75) Inventors: Tetsuo Tateishi, Nagoya Aichi (JP); Matthew D Romig, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/177,734

(22) Filed: Jul. 7, 2011

(51) Int. Cl.
*H01L 23/495* (2006.01)
(52) U.S. Cl. ..................................... 257/676
(58) Field of Classification Search ............. 257/676, 257/777, 666, 672
See application file for complete search history.

(56) References Cited

U.S. PATENT DOCUMENTS

| | | | | |
|---|---|---|---|---|
| 6,781,219 B2 * | 8/2004 | Bissey | | 257/666 |
| 6,815,746 B2 * | 11/2004 | Suzuki et al. | | 257/296 |
| 7,485,954 B2 | 2/2009 | Havanur | | |
| 7,936,054 B2 * | 5/2011 | Eom et al. | | 257/675 |
| 2007/0090496 A1 * | 4/2007 | Otremba | | 257/666 |
| 2008/0258277 A1 * | 10/2008 | Hosseini et al. | | 257/676 |
| 2009/0278242 A1 * | 11/2009 | Chuang et al. | | 257/676 |
| 2010/0171543 A1 | 7/2010 | Korec et al. | | |
| 2012/0193772 A1 * | 8/2012 | Jiang | | 257/666 |

\* cited by examiner

*Primary Examiner* — Thao P. Le
(74) *Attorney, Agent, or Firm* — Steven A. Shaw; W. James Brady; Frederick J. Telecky, Jr.

(57) ABSTRACT

A synchronous Buck converter in a molded package (thickness 101 between 0.8 and 1.0 mm) has vertically assembled control (110) and sync (120) power FET chips and a driver chip (630). The sync chip has one power terminal attached to the leadframe pad (104) and the opposite power terminal covered by a first copper layer (125) connected (210) to a first leadframe terminal (105), the first layer providing a smaller resistance to a current between first terminal and pad than the resistance through the sync chip. The control chip has one power terminal attached to the first layer and the opposite power terminal covered by a second copper layer (115) connected (410) to a second leadframe terminal (106), the second layer providing a smaller resistance to a current from the first to the second terminal than the resistance through the control chip. Connections (210, 410) of layers (125, 115) to leadframe terminals (105, 106) are copper wires of 20 to 50 μm diameter, enabling currents between 3 and 30 A.

12 Claims, 7 Drawing Sheets

STRUCTURE AND METHOD FOR UNIFORM CURRENT DISTRIBUTION IN POWER SUPPLY MODULE

FIELD OF THE INVENTION

The present invention is related in general to the field of semiconductor devices and processes, and more specifically to the system structure and fabrication method of a small-size, low cost and scalable power supply system having high efficiency and operating at high frequency and high current.

DESCRIPTION OF RELATED ART

Among the popular families of power switching devices are the DC-DC power supply circuits, especially the category of Switched Mode Power Supply circuits. Particularly suitable for the emerging power delivery requirements are the synchronous Buck converters with two power MOS field effect transistors (FETs) connected in series and coupled together by a common switch node. In the Buck converter, the control FET chip, also called the high side switch, is connected between the supply voltage $V_{IN}$ and the LC output filter, and the synchronous (sync) FET chip, also called the low side switch, is connected between the LC output filter and ground potential (the sync FET works as a synchronous rectifier substituting for a free wheeling diode). Power supply modules are required to handle currents between about 10 and 25 A. The gates of the control FET chip and the sync FET chip are connected to an integrated circuit (IC) chip acting as the driver of the converter, and the driver, in turn, is connected to a controller IC. The inductor of the output circuitry serves as the energy storage of the power supply circuit; consequently, the inductor has to be a large enough component (typical sizes are 300 to 400 nH) to reliably function for maintaining a constant output voltage $V_{OUT}$.

For many of today's power switching devices, the chips of the power MOSFETs and the driver and controller IC are assembled as separate components. Each chip is typically attached to a rectangular or square-shaped pad of a metallic leadframe; the pad is surrounded by leads as output terminals. The leads are commonly shaped without cantilever extensions, and arranged in the manner of Quad Flat No-Lead (QFN) or Small Outline No-Lead (SON) devices. The electrical connections from the chips to the leads are provided by bonding wires. Each assembly is typically packaged in a plastic encapsulation, and the packaged components are employed as discrete building blocks for board assembly of power supply systems.

In other power switching devices, the power MOSFET and driver-and-controller ICs are assembled side-by-side on one or more leadframe pads, which in turn is surrounded on all four sides by leads serving as device output terminals. The leads are shaped in QFN or SON fashion. The electrical connections between chips and leads are provided by bonding wires. The assembled devices are packaged in a plastic encapsulation.

In some recently introduced advanced assemblies, clips (made of copper) substitute for many connecting wires. These clips are wide and introduce minimum parasitic inductance.

In another recently introduced scheme, the control FET chip and the sync FET chip are assembled vertically on top of the other as a stack, with the physically larger-area chip of the two attached to the leadframe. This vertical assembly is favored to save real estate area of the board. Independent of the physical size, the sync FET chip needs a larger active area than the active area of the control FET chip, due to considerations of duty cycle and conduction loss. When both the sync chip and the control chip are assembled source-down, the larger (both physically and active area) sync chip is assembled onto the leadframe pad and the smaller (both physically and active area) control chip has its source tied to the drain of the sync chip, forming the switch node, and its drain to the input supply $V_{IN}$. A clip inserted between the two FETs connects to the switch node. An elongated clip on the stack top connects the drain terminal of the control FET to input supply $V_{in}$. The leadframe pad is at ground potential and serves as a spreader of operationally generated heat; the converter is required to handle currents between about 10 and 25 A

SUMMARY OF THE INVENTION

Applicants observed that the metal clips, which interconnect vertically stacked power FET chips in power supply modules for switching currents between about 10 and 25 A, are poorly suited for customization, since customization emphasizes scalability and time-to-market. Clips have limited flexibility for shrinking and require long lead times for redesign and re-order. Furthermore, clips increase the height of the chip stacks and are expensive not only with regard to initial device cost, but also with regard to cost-of-ownership especially in view of the reliability of the required large-area solder layers.

Applicants recognized that replacing the clips employed for interconnection in FET power supplies by thick bonding wires solves the cost problem and offers automated bonders for rapid response to customer requests and scalability. Thick bonding wires further have established process controls for creating reliable connections. However, while using customary power FET chips, applicants found that assembled power supply modules did not reach the expected high switching currents between 10 and 25 A. Instead, applicants discovered crowding of the switch current entering at the switch node (the interface of control and sync FETS) and exiting at $V_{in}$, with subsequent local overheating.

In analyzing the problem, applicants discovered that the horizontal resistance of the solder or epoxy layer attaching the metalized top terminal of the sync FET to the metalized bottom terminal of the control FET was considerably larger for a current trying to spread laterally through the layer, than the vertical resistance along the height of the semiconductor control FET chip for a current flowing vertically through the chip. The switch current is thus inhibited to distribute uniformly throughout the solder or epoxy attachment zone before entering the control FET chip; instead, the switch current is crowding into the lower resistance chip region closest to the switch node.

Applicants solved the current crowding problem by depositing an extra metal layer on the top terminal area of the sync FET chip. The selected metal or alloy is preferably copper- or aluminum-based and optionally includes a solderable finish, such as a thin layer of palladium or gold. The thickness of the extra metal layer is selected so that the resistance for a current flowing laterally through the layer area is equal to or less than the resistance for the current, spread over the control chip area, flowing vertically through the control FET chip height. Due to the low lateral resistance, the current will spread approximately uniformly across the bottom terminal before entering the control FET to flow through the chip to the top terminal, enabling the flow of currents between 15 and 30 A without crowding (and without the alternative use of metal clips). Similarly, it is advantageous to deposit an extra metal layer on the top terminal area of the control FET chip to enable a low resistance lateral current flow to $V_{IN}$.

When the sync FET chip is attached to the pad of a leadframe, analogous considerations hold for a current flowing from the switch terminal through the sync FET chip to the leadframe pad at ground potential. An extra metal layer is deposited on the top terminal area of the sync FET chip. The preferred metal is copper with a layer thickness so that the resistance for a current flowing laterally through the layer area is equal to or less than the resistance for the current, spread over the sync chip area, flowing vertically through the sync FET chip height. Due to the low lateral resistance, the current will spread approximately uniformly across the bottom terminal before entering the sync FET to flow through the chip to the bottom terminal, enabling the flow of currents between 15 and 30 A without crowding (and without the alternative use of metal clips).

One embodiment of the invention is a synchronous Buck converter in a molded package, wherein the vertically assembled control and sync chips have on their top terminal areas an extra copper layer in the thickness range from 1 to 15 µm. The chip terminal connections to the leadframe leads (package pins) are performed by ball bonded copper wires with a wire diameter between 20 to 50 µm, enabling currents between 3 and 30 A. Using today's chip thicknesses and bonding technology, the molded package has a thickness between 0.8 and 1.0 mm, compared to a package thickness of 1.5 mm for clip-assembled converters. Using chip thicknesses and bonding technology under development, a package thickness of only 0.4 mm will be feasible.

Another embodiment of the invention is a plastic encapsulated synchronous Buck converter including a driver and controller chip assembled on the leadframe pad and wire bonded to the package pins. In the assembly process flow, all chip attachments use the same solder paste as interconnect in order to be reflowed together in a unified reflow step. In a first step, the solder paste places the driver and controller chip with its solderable back side metallization on the solderable surface of the leadframe pad. In the next step, the solder paste places the solderable bottom (preferably the source) terminal of the sync FET chip on the pad; the sync chip has an extra metal layer with an optional solderable finish on its top terminal. Then the solderable bottom (preferably the source) terminal of the control FET chip is placed with solder paste on the first chip; the control chip has an extra metal layer on its top terminal. Then, the entire stacked assembly is reflowed together to form the solder connections. Next, using copper wires of thick diameter, the chip terminals are connected to the leadframe leads; they become the package pins after the assembly is encapsulated in a plastic packaging compound.

Another embodiment of the invention is a plastic encapsulated synchronous Buck converter including a driver and controller chip assembled on the leadframe pad and wire bonded to the package pins. In the assembly process flow, all chip attachments use the same conductive epoxy as interconnect. In a first step, the epoxy places the driver and controller chip with its back-side metallization on the surface of the leadframe pad, and this epoxy is cured. In the next step, the epoxy places the bottom (preferably the source) terminal of the sync FET chip on the pad; the sync chip has an extra metal layer on its top terminal. Then the bottom (preferably the source) terminal of the control FET chip is placed with epoxy on the first chip; this epoxy is cured. The control chip has an extra metal layer on its top terminal. Next, using copper wires of thick diameter, the chip terminals are connected to the leadframe leads; they become the package pins after the assembly is encapsulated in a plastic packaging compound.

BRIEF DESCRIPTION OF THE DRAWINGS

FIGS. 7A through 7G display certain steps of the process flow for assembling and packaging a synchronous Buck converter according to an embodiment of the invention.

DETAILED DESCRIPTION OF THE PREFERRED EMBODIMENTS

Figure 1A:
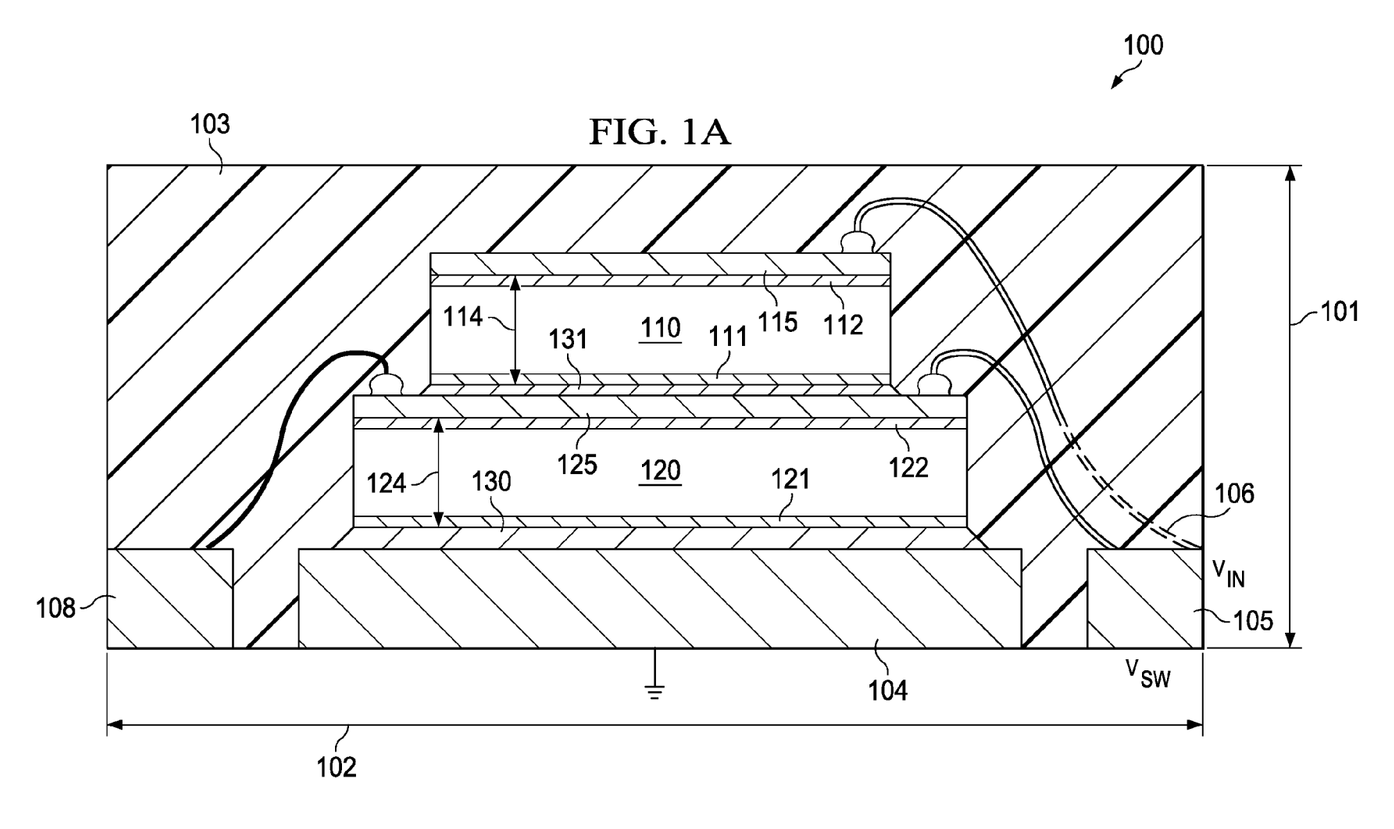
FIG. 1A shows a cutaway view of a wire bonded synchronous Buck converter including stacked control and sync chips with extra metal layers on the top terminal areas, the stack attached to a leadframe pad and packaged in encapsulation compound.

FIG. 1A illustrates a cross section (simplified and not to scale) of a power supply module generally designated 100 as an exemplary embodiment of the invention. The module dimensions are outlined by encapsulation material 103. A preferred material is an epoxy-based molding compound. The exemplary module of FIG. 1 has a thickness 101 between about 0.8 and 1.0 mm. Consequently, the exemplary module has, due to the lack of metal clips, a smaller thickness than conventional modules with clips (about 1.5 mm thick). It should be noted that design and process improvements under development (such as low-rise wire bonds and thinner chips) will allow a future module thickness of about 0.4 mm. The length 102 of module 100 may be 6 mm, and the width (not shown in FIG. 1A) may be 5 mm. Other modules of the configuration of FIG. 1A may range from 2 by 2 mm to 5 by 7 mm.

Figure 1B:
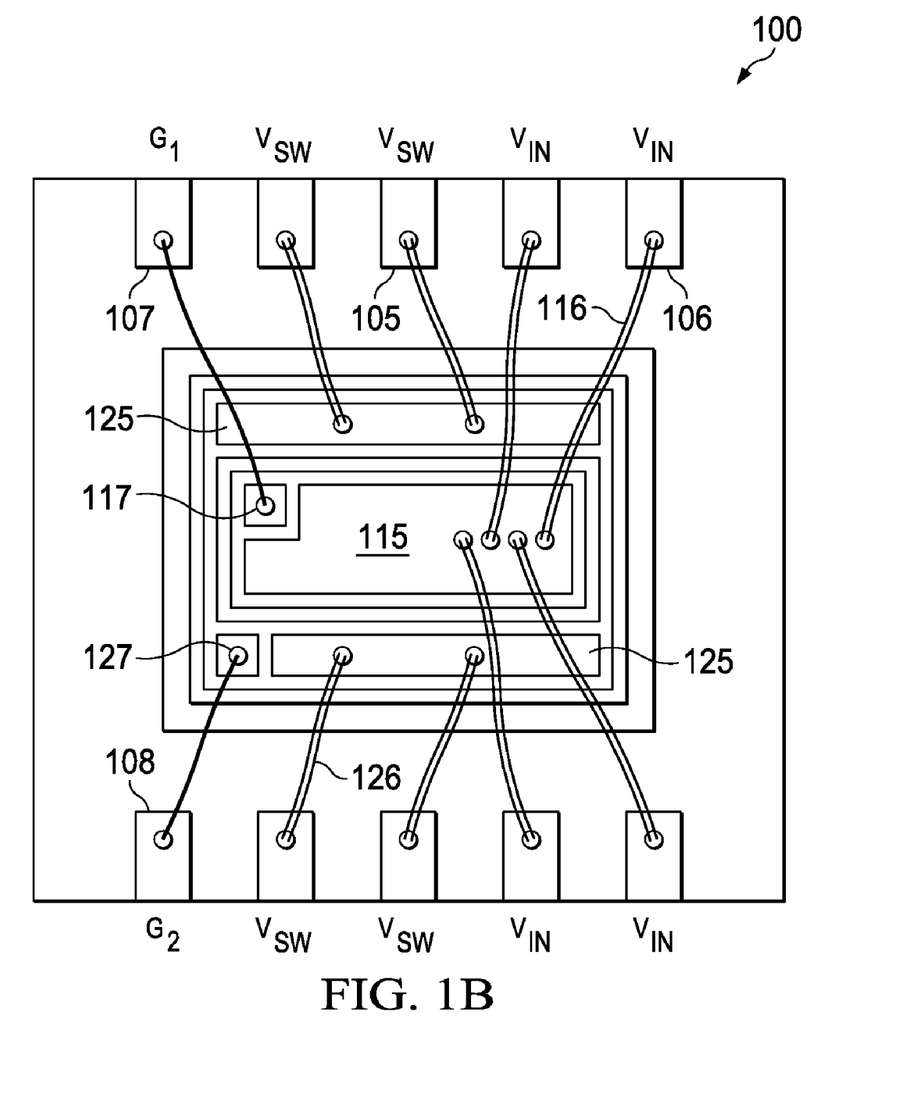
FIG. 1B illustrates a top view of a synchronous Buck converter including stacked control and sync chips wire bonded to leads (pins) of the leadframe as the package terminals of the converter.

A metal leadframe, generally suitable for Quad Flat No-Lead (QFN) and Small Outline No-Lead (SON) type modules, includes a rectangular pad 104 and a plurality of leads (105 to 1008, see FIG. 1B). The leadframe is preferably made of copper or a copper alloy; alternative metal selections include aluminum, iron-nickel alloys, and Kovar™. Both surfaces of the leadframe may be prepared to facilitate solder attachment or wire bond placement, for instance by a sequence of plated layers of nickel, palladium, and gold. In addition, at least one surface may have a metal layer deposited to enhance thermal conductivity, for instance by a plated layer of silver. Preferred thickness of the leadframe metal for the exemplary embodiment shown in FIG. 1A is between 0.1 and 0.2 mm; other embodiments may use thinner or thicker leadframe metal. From the standpoint of low cost and batch processing, it is preferred to start with sheet metal and fabricate the leadframe as a strip by stamping or etching, and to singulate the leadframe for the module by trimming the strip after the encapsulation process.

FIG. 1A shows two power field-effect transistor (FET) chips assembled as a power supply module; each chip a first terminal on one chip surface and two other terminals on the opposite surface. For many embodiments, the drain terminal is on one surface and the source and gate terminals are on the opposite surface; for other embodiments, different distributions are possible. For the embodiment in FIG. 1A, the high side FET of the module is the control FET 110 and the low side FET is the sync FET 120. The control FET chip 110 and the sync FET chip 120 are assembled as a vertical stack and attached to pad 104. As pointed out above, due to considerations of duty cycle and conduction loss, the sync FET chip needs a larger active area than the active area of the control FET chip, independent of the physical size.

In the example of FIG. 1A, both the sync chip and the control chip are assembled source-down. The larger (both physically and active area) sync chip 120 has its source terminal 121 assembled (preferably by a conductive epoxy layer 130) onto the leadframe pad 104 and the smaller (both physically and active area) control chip 110 has its source 111 tied to the drain 122 sync chip, forming the switch node (attachment preferably uses conductive epoxy layer 131). The drain 112 of the control chip is tied to the input supply terminal 106 ($V_{IN}$). For the exemplary embodiment shown in FIG. 1A, low side chip 120 has a size of about 3.5×2.84 mm, and a thickness or height 124 of 0.1 mm; high side chip 110 has a size of about 2.5×1.8 mm, and a thickness of 0.1 mm. For other embodiments, the die sizes and the die thicknesses may have significantly smaller or greater values. The trend for chip thicknesses 114 and 124 is towards smaller values. The preferred thickness of layers 130 and 131 is at least 25 µm. The conductive epoxy material, for instance a silver-filled epoxy, is selected so that the same material can be used for all epoxy joints of the power supply module, allowing for reuse of the same manufacturing processes. Alternatively, a solder material may be used for layers 130 and 131, and may be selected so that the same solder material can be used, allowing for a single solder reflow step for assembling the module.

FIG. 1A indicates an extra metal layer 125 on the top terminal area of the sync FET chip 120 and an extra metal layer 115 on the top terminal area of the control FET chip 110. The selected metal or alloy is preferably copper-based or aluminum-based and may include a solderable finish, such as a thin layer of palladium or gold, so that the terminals are metallurgically suitable for wire bonding. The thickness of the extra metal layer 125, preferably between about 1 and 15 µm, is selected so that the resistance for a current flowing laterally through the layer area is equal to or less than the resistance for the current, spread over the control chip area, flowing vertically through control FET chip height 124. Due to the low lateral resistance, the current is enabled to spread approximately uniformly across layer before entering either the sync FET chip (see FIG. 2) or the control FET chip (see FIG. 4). More detail about layers 115 and 125 in conjunction with FIGS. 2 thru 5.

As FIG. 1A shows, metal layers 115 and 125 are metallurgically suitable for wire bonding; the illustrated connections are ball bonds, however the bondability of layers 115 and 125 also applies to other metal bonds such as stitch bonds, stand-off stitch bonds (SSB), ball stitch on bump (BSOB), pressure bonds, wedge bonds, and welded bonds. For ball bonds, the preferred wire metal is copper-based with diameters ranging from 20 to 50 µm and balls of about 1.4 wire diameters; the preferred wire diameter is between 35 and 50 µm. Many embodiments use wires with the same diameter for all connections; other embodiments (such as the example shown in FIG. 1A) may use some wires of thicker diameter than other wires.

Since metal layer 125 is at the switch node and has a substantial thickness between 1 and 15 µm, it practically reduces to zero the parasitic common source inductance $L_{CS}$ between the source of the control chip and the switch node.

Such common source inductance, if allowed to exist, would degenerate the applied gate drive voltage $V_{GS}$ to the reduced effective voltage $V_{EFF}$ across gate-to-source of the control FET:

$$V_{EFF} = V_{GS} - L_{CS} \cdot dI_{DS}/dt,$$

wherein $I_{DS}$ is the drain current. Since the switching time $t_{SW}$ of the control FET is an inverse function of the effective voltage $V_{EFF}$, the vanishing of the parasitic inductance $L_{CS}$ has the further consequence of reducing the switching time $t_{SW}$, which in turn decreases the switching losses $P_{SW}$:

$$P_{SW} = V_{DS} \cdot I_{DS} \cdot t_{SW} \cdot f_{SW},$$

wherein $f_{SW}$ is the switching frequency of the synchronous Buck converter.

Furthermore, since the power loss in a synchronous Buck converter is determined by:

$$\text{power loss} = I_L^2 R + P_{SW}$$

(wherein $I_L$=load current, R=intrinsic resistance, $P_{SW}$=switching loss), reductions of switching losses $P_{SW}$ drive a reduction of power losses, which in turn improve the efficiency of the converter:

$$\text{efficiency} = \text{output power}/\text{input power}$$
$$= \text{output power}/(\text{output power} - \text{power loss}).$$

Increasing the efficiency through reducing the power loss enables the synchronous Buck converter to operate at a higher frequency. The ability to operate the synchronous Buck converter at a higher frequency, for example at 1 MHz instead of at 500 kHz, and at substantially unchanged output current and efficiency, allows customers to reduce transient time response to load and thus the number of passive components such as capacitors surrounding the converter, saving board real estate and reducing heat generation.

FIG. 1B depicts a top view of the exemplary power supply module 100 of FIG. 1A. In this example, the extra metal layer 115 is connected by four thick wire bonds 115 to package input terminals $V_{IN}$, designated 106. The sum of wires can handle the high currents (3 to 30 A) of the power supply module. In addition, thick bonding wires 126 are used for connecting the extra metal layer 125 of the switch node to the respective package switch terminals, designated 105. Gate 117 of the control FET and gate 127 of the sync FET may also be connected by thick wires to their respective package terminals 107 and 108, respectively; alternatively, as shown on FIG. 1B, thinner bonding wires may suffice.

Figure 3:
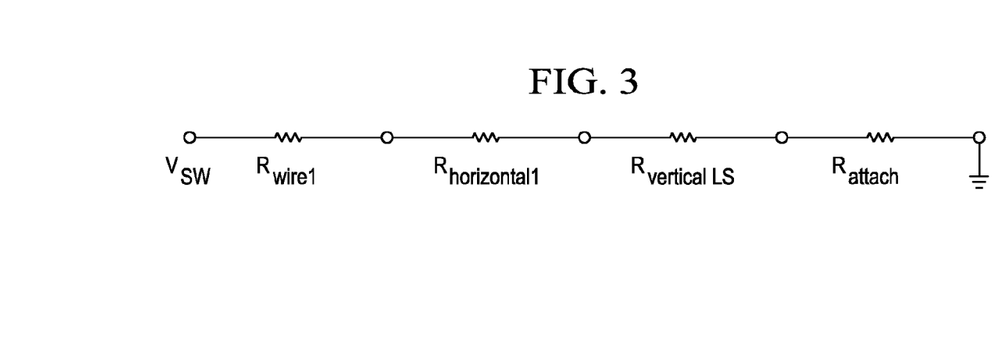
FIG. 3 shows schematically the electrical elements contributing to the current flow of FIG. 2.
Figures 4, 5:
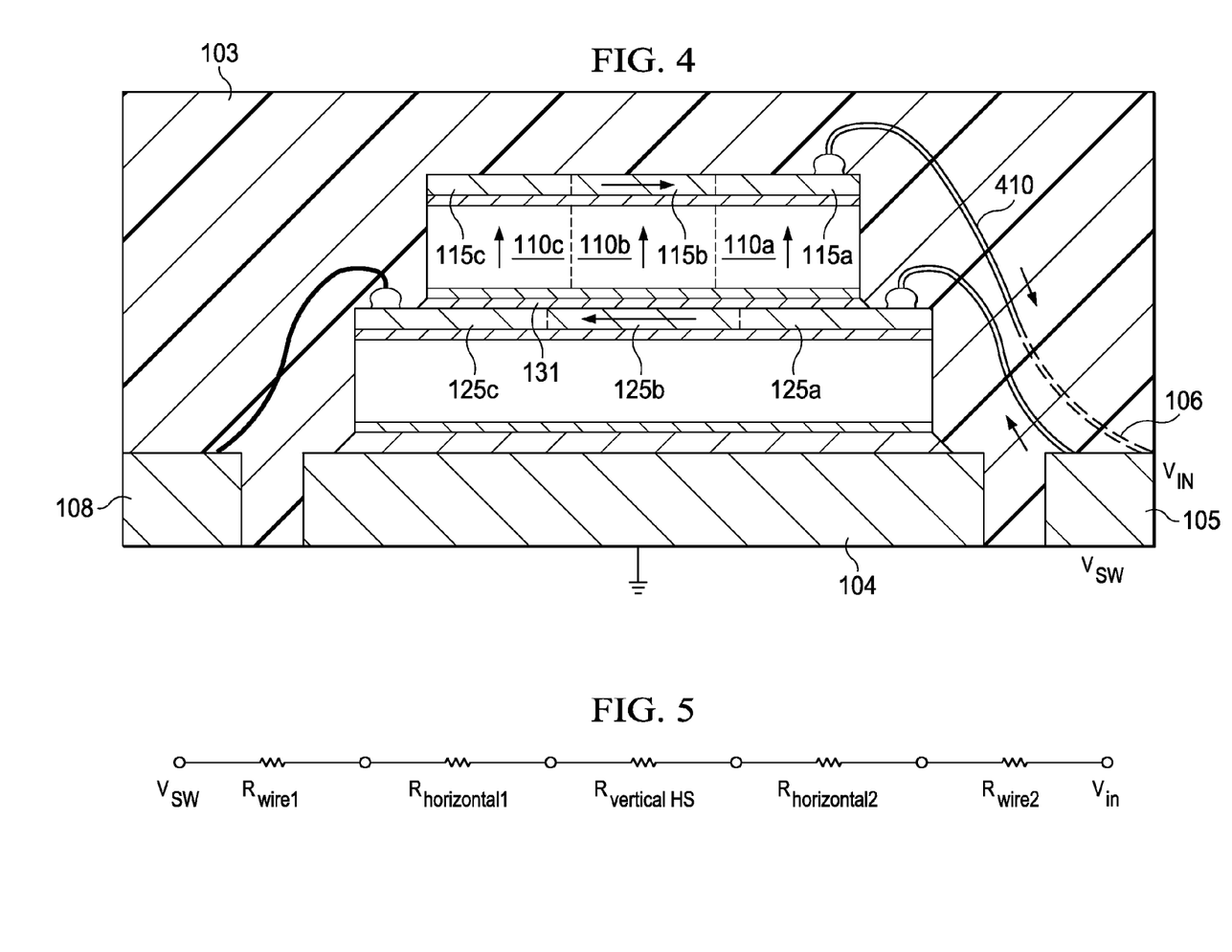
FIG. 4 depicts the cutaway of FIG. 1 to illustrate the distribution of an electrical current flowing from the package switch node terminal $V_{SW}$ to the package input terminal $V_{IN}$.
FIG. 5 shows schematically the electrical elements contributing to the current flow of FIG. 4.

Power supply modules lacking the extra metal layers 115 and 125 have to operate well below specified current capabilities or may even experience failures by current crowding and overheating. In order to determine an appropriate thickness and composition of the extra metal layer, FIGS. 2 and 3 consider the effect of an extra metal layer 125 on a power current flowing from the package switch terminal 105 to ground terminal 104; FIGS. 4 and 5 consider the effect of an extra metal layer 115 on a power current flowing from the package switch terminal 105 to the $V_{IN}$ terminal 106.

Figure 2:
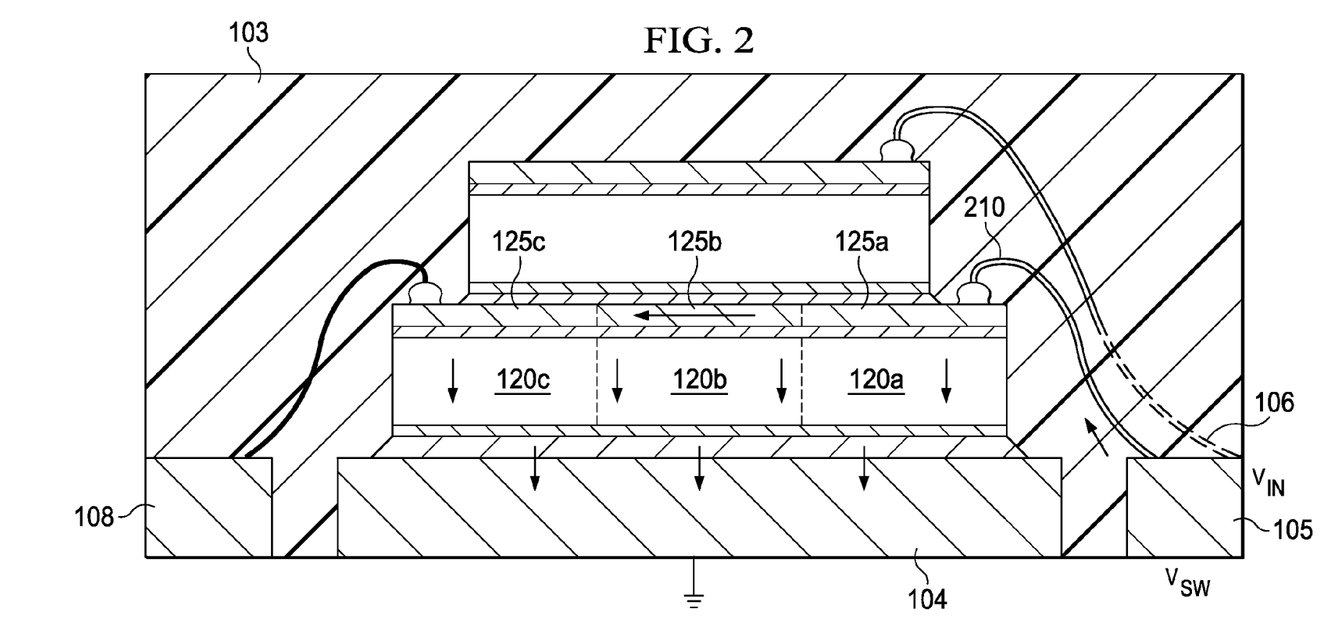
FIG. 2 depicts the cutaway of FIG. 1 to illustrate the distribution of an electrical current flowing from the package switch node terminal $V_{SW}$ to the leadframe pad at ground potential.

For FIG. 2, extra metal layer 125 is connected by wire 210 with resistance $R_{wire1}$ between 0.5 and 2.0 mΩ to switch terminal $V_{SW}$ (105). For a model calculation, layer 125 and sync FET chip (low side, LS) 120 are divided into three regions of physically equal size. Each sync chip region has the same resistance $R_{FET}=R_{verticalLS}$ between 1 and 5 mΩ. In FIG. 2, the sync chip regions are designated 120a (region closest to wire connection 210); 120b (center region); and 120c (region farthest remote from wire 210). The respective regions of layer 125 are designated 125a; 125b; and 125c. Layer 125 is considered for two modifications: A) aluminum (Al) layer, 3 μm thick, sheet resistance 10 mΩ/square; B) copper (Cu) layer, 10 μm thick, sheet resistance 2 mΩ/square. The preferred realization is the copper layer due to copper's almost twice better electrical conductivity and seamless conformance with standard processing. For the spreading resistance $R_{spread1}=R_{horizontal1}$ of the respective layer region, the model calculation delivers:

Region 125a:
  10 μm Cu, $R_{spread1}$=0 to 1 mΩ; $R_{total}$=1.5 to 8 mΩ;
  3 μm Al, $R_{spread1}$=0 to 5 mΩ; $R_{total}$=1.5 to 12 mΩ;
Region 125b:
  10 μm Cu, $R_{spread1}$=1 to 2 mΩ; $R_{total}$=2.5 to 9 mΩ;
  3 μm Al, $R_{spread1}$=5 to 10 mΩ; $R_{total}$=6.5 to 17 mΩ;
Region 125c:
  10 μm Cu, $R_{spread1}$=2 to 4 mΩ; $R_{total}$=3.5 to 11 mΩ;
  3 μm Al, $R_{spread1}$=10 to 20 mΩ; $R_{total}$=11.5 to 27 mΩ;
wherein $R_{total}=R_{wire1}+R_{spread1}+R_{verticalLS}$. The attachment resistance of the solder layer 130 is omitted in this sum, since it has a small value due to the uniform and relatively thick solder layer; the solder resistance further contributes the same value for each region. The complete sum of resistances is depicted in FIG. 3.

Assuming $R_{wire1}$=1 mΩ and $R_{verticalLS}$=2 mΩ for each region, the calculated $R_{total}$ values result in the following values for the current in each region:

Region 125a:
  10 μm Cu, 43 to 44% of total current;
  3 μm Al, 51 to 62% of total current;
Region 125b:
  10 μm Cu, 32 to 35% of total current;
  3 μm Al, 23 to 31% of total current;
Region 125c:
  10 μm Cu, 22 to 26% of total current;
  3 μm Al, 14 to 18% of total current.

As the model calculation shows, an extra metal layer 125 selected either as a 3 μm thick aluminum layer or as a 10 μm thick copper layer will prevent current crowding and thus prevent module failure by overheating. The calculation further shows that a 10 μm thick Cu layer will approach, to a great degree, an almost equal current distribution throughout the horizontal layer 125 as a basis for uniform current flow through the FET chip. Consequently, the current will be able to pass through the FET chip uniformly and at uniform current density, allowing the power supply module to handle maximum current.

Analogous model calculations can be performed for determining the effect of extra metal layer 115 on a power current flowing between the package switch terminal $V_{SW}$ (105) and the $V_{IN}$ terminal 106. An exemplary current flow from $V_{SW}$ to $V_{IN}$ is depicted in FIG. 4. Extra metal layer 115 is connected by wire 410 to switch terminal $V_{SW}$ (105); the resistance $R_{wire2}$ of wire 410 is practically the same (between 0.5 and 2.0 mΩ) as the resistance $R_{wire1}$ for wire 210. For a model calculation, layer 115 and control FET chip (high side, HS) 110 are divided into three regions of physically equal size. Each control chip region has the same resistance $R_{FET}=R_{verticalHS}$ between 1 and 5 mΩ. In FIG. 4, the control chip regions are designated 110a (region closest to wire connection 410); 110b (center region); and 110c (region farthest remote from wire 410). The respective regions of layer 115 are designated 115a; 115b; and 115c. Layer 115 is considered for two modifications: A) aluminum (Al) layer, 3 μm thick, sheet resistance 10 mΩ/square; B) copper (Cu) layer, 10 μm thick, sheet resistance 2 mΩ/square. The preferred realization is the copper layer due to copper's almost twice better electrical conductivity and seamless conformance with standard processing. For the spreading resistance $R_{spread2}=R_{horizontal2}$ of the respective layer region, the model calculation has to consider that the current from $V_{SW}$ first has to spread through the regions 125a, 125b, and 125c (and solder layer 131) before it can enter the control FET chip regions 110a, 110b, and 110c. Based on the above resistance contributions, the total resistance is calculated as the following sum (see FIG. 5):

$$R_{total}=R_{wire1}+R_{spread1}+R_{vertical\ HS}+R_{spread2}+R_{wire2}.$$

Using actual resistance values, the calculations demonstrate for layer 115 a result analogous to the above result for layer 125: Layer 115 may be selected either as a 3 μm thick aluminum layer or as a 10 μm thick copper layer; for both selections it will prevent current crowding and thus prevent module failure by overheating. The calculation further shows that a 10 μm thick Cu layer will approach, to a great degree, an almost equal current distribution throughout the horizontal layer 115 as a basis for uniform current flow through the FET chip. Consequently, the current will be able to pass through the FET chip uniformly and at uniform current density, allowing the power supply module to handle maximum current.

Figure 6A:
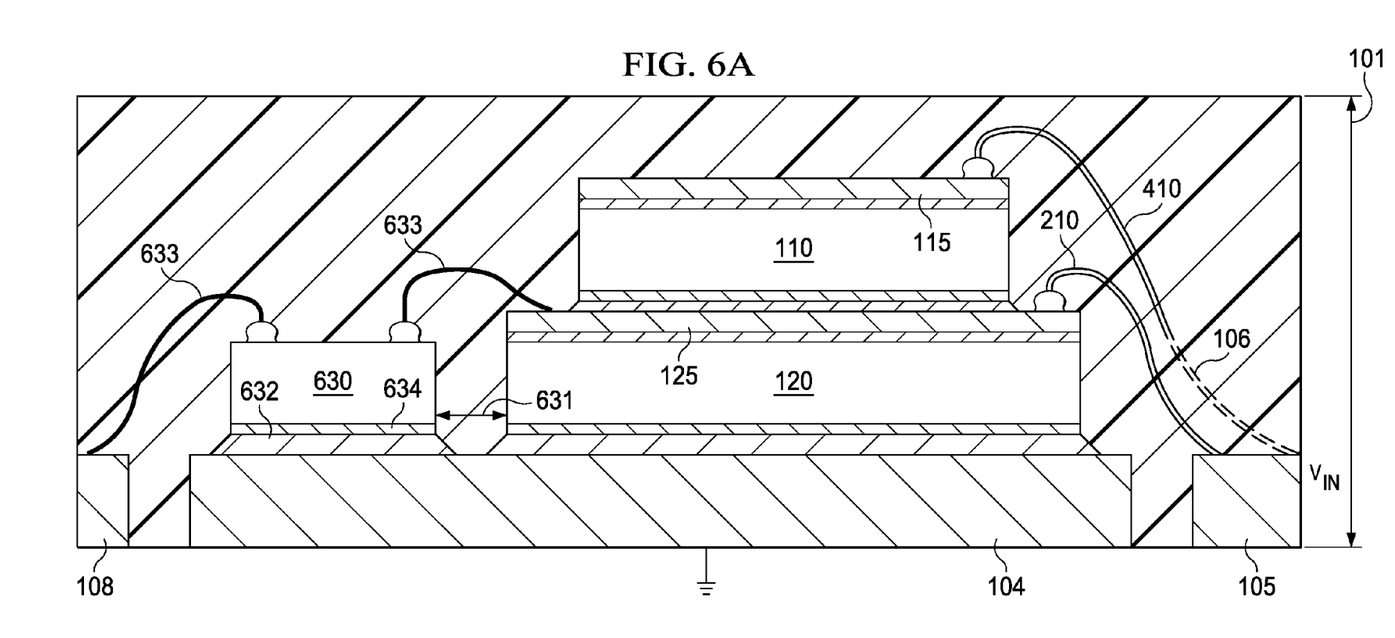
FIG. 6A shows a cutaway view of a wire bonded synchronous Buck converter including stacked control and sync chips with extra metal layers on the top terminal areas, the stack attached to a leadframe pad, which further has a driver and controller chip attached; the assembly is packaged in encapsulation compound.
Figure 6B:
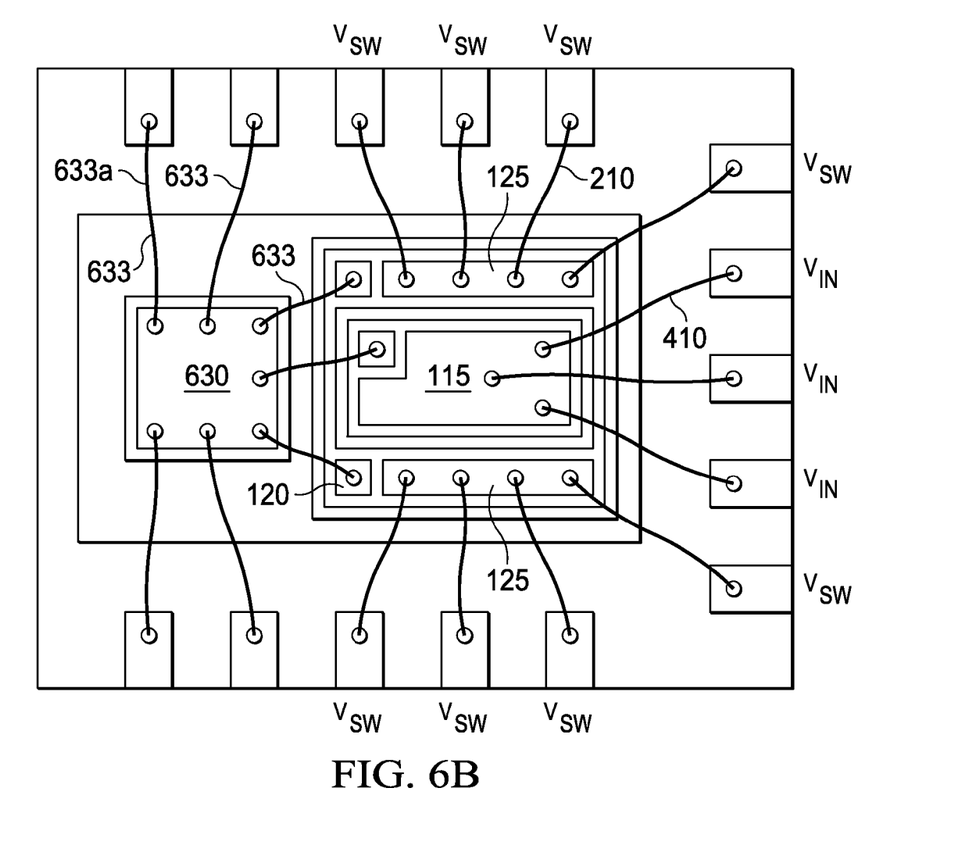
FIG. 6B illustrates a top view of a synchronous Buck converter including stacked control and sync chips and a driver and controller chip, the chips wire bonded to leads (pins) of the leadframe as the package terminals of the converter.

FIGS. 6A and 6B illustrate another embodiment, extending the module of FIGS. 1A and 1B to include integrated circuit (IC) chip 630 attached to the same leadframe pad 104. Chip 630 is in close proximity to the vertically stacked FET chips 110 and 120 and provides driver and controller functions for the power supply system. In the exemplary embodiment of FIG. 6A, the distance 631 between chip 630 and chip 120 may be about 300 μm. Chip 630 may have back side metallization 634 to allow attachment to leadframe pad 104 by conductive epoxy or solder layer 632 (preferably about 25 μm thick). The conductive epoxy or metallic solder provide high thermal conductivity for spreading heat from chip 630 to pad 104. In the exemplary embodiment shown in FIG. 6A, chip 630 is square shaped (side length about 1.4 to 1.5 mm) and 0.2 mm thick. Other embodiments may have chips, which are smaller or greater, and thicker or thinner. For example, in some modules chip 630 and chips 110 and 120 have the same thickness.

As FIGS. 6A and 6B show, the terminals of chip 630 are bonded by wires 633 to the respective leadframe terminals and FET terminals. If chip 630 is narrower than or similar to chip 120, the distance between the leadframe terminals and the terminals on chip 630 may stretch the wire spans such that any height difference due to the thickness of chip 630 becomes insignificant; as an example, see wire 633a in FIG. 6B. Consequently, the wire connections 633 can be provided without the concern of downhill bonding to shorten the bond wire to the edge of the chip. The elimination of the wire-shortening risk enhances the reliability of the module assembly. The preferred diameter of bonding wires 633 is about 25 µm; the diameter may, however, be smaller than or as great as the diameter of bonding wires 210 and 410 (20 to 50 µm).

Based on the module structure of FIGS. 6A and 6B, another embodiment of the invention is a method for fabricating a 3-dimensional synchronous Buck converter. The method is suitable for fast and low-cost batch processing, since all attachments are performed by a single epoxy or single solder material and a single cure or reflow temperature so that a single one-step-fits-all attachment process can be employed. For solder, the paste is selected so that the solder reflow temperature is higher than the temperature of wire bonding. Further, downhill wire bonding is almost completely avoided. In addition it is preferred that the leadframe is provided in strip form and is singulated only after the encapsulation step.

The fabrication method, displayed in FIGS. 7A through 7G, starts with the step of providing a leadframe, which has a rectangular flat assembly pad and a plurality of terminal leads positioned in line with at least two opposite sides of the pad. A preferred leadframe metal is copper or a copper alloy in a thickness range from about 100 to 200 µm; other options include aluminum, an iron-nickel alloy, and Kovar™. Both surfaces of the pad may have a metallurgical disposition, which facilitates solder wetting and solderability. As an example for copper leadframes, the pad surfaces may have additional plated layers of nickel, palladium and gold (outermost). For the leads, the surfaces facing the chips-to-be-assembled are wire bondable (preferred wire metals include copper and gold), for instance by a spot-plated layer of gold. The opposite lead surfaces are preferably solderable.

In the next step, a conductive polymeric thermoset material is selected, preferably configured as an epoxy-based silver-filled precursor, which has a polymerization (cure) temperature of about 175° C. The polymeric material is used throughout the assembly.

Alternatively, in the next step a solder mixture is selected, preferably configured as a tin-based paste, which has a reflow temperature higher than the temperature used for wire bonding, which is about 220° C.; the paste is used throughout the assembly.

Figure 7A:
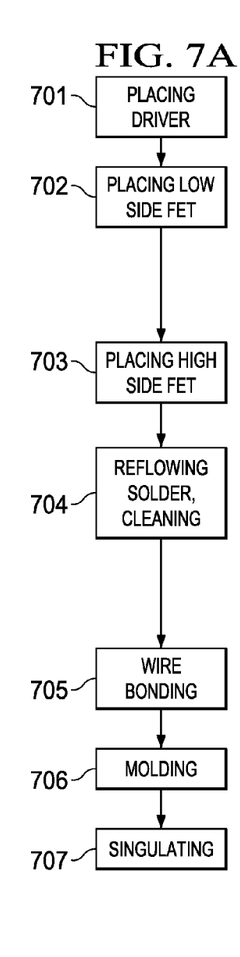
FIG. 7A is a schematic process flow diagram.
Figure 7B:
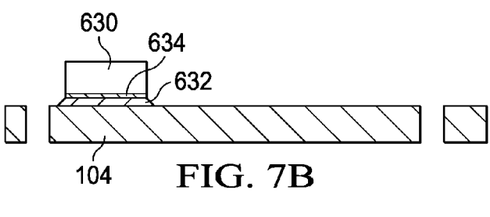
FIG. 7B displays the step of placing a driver chip on a leadframe pad.
Figure 7C:
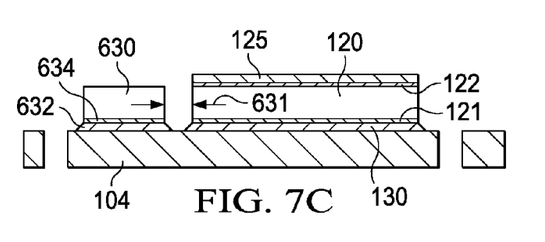
FIG. 7C shows the process step of placing the low-side transistor on the pad.

The sequence of certain process flow steps for fabricating a power supply module according to the invention is listed in FIG. 7A, designated 701 through 707, and illustrated in schematic cross sections in FIGS. 7B through 7G. The assembly starts in step 701 by placing a driver-and-controller chip 630 on the leadframe pad 104 using a layer 632 of conductive epoxy or solder paste (thickness about 25 µm or greater) as an adhesive; see FIG. 7B. In the case of solder, the paste 632 may be dispensed on pad 104 preferably by screen printing, alternatively by a syringe. For facilitating soldering, chip 630 may have back side metallization 634 (for instance a layer of nickel or titanium-tungsten followed by a layer of palladium) in order to render the back side of semiconductor chip 630 solderable.

In the next step 702, a sync FET chip 120 (low side FET) is placed adjacent to driver-and-controller chip 630 onto a layer 130 of conductive epoxy or solder paste dispensed on pad 104; see FIG. 8C. The placement of FET chip 120 is preferably source down; the source of the synchronous FET faces the leadframe pad. In other embodiments, the drain of the sync FET faces the pad. Preferred thickness of epoxy or solder layer 130 is about 25 µm or greater. The chip surface remote from pad 104 is covered by an extra metal layer 125 preferably including copper or aluminum. The thickness of layer 125 preferably ranges from about 1 to 15 µm and is selected so that the resistance for a current flowing laterally through the layer area is equal to or less than the resistance for the current, spread over the control chip area, flowing vertically through sync FET chip 120 or control FET chip 110. Due to the low lateral resistance, the current is thus enabled to spread approximately uniformly across layer before entering either the chip 120 or chip 110 (see FIG. 7D). In order to keep parasitics as small as possible, the distance 631 between chip 630 and chip 120 is preferably selected as narrow as assembly layout rules allow, without risking an accidental merging of the adjacent meniscus of the liquefied solder layers 632 and 130 during the reflow process, which would be coupled with surface tension-induced relative movements of chip 630 and chip 120. As an example, for certain epoxies or solder alloys and layer thicknesses, about 300 µm is a preferred distance.

Figure 7D:
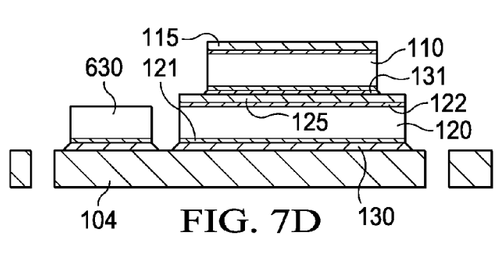
FIG. 7D illustrates the process step of stacking the high-side transistor on the low-side transistor.

In the next process step 703, illustrated in FIG. 7D, a control FET chip 110 (high side FET) is placed onto a layer 131 of epoxy or solder paste dispensed on layer 125. The placement of FET chip 110 is preferably source down, facing layer 125; the drain of the control FET, covered by metal layer 115, will be connected to the input supply voltage $V_{IN}$. In other embodiments wherein the sync FET chip 120 has its source terminal covered by metal layer 125, the drain of the control FET 110 faces metal layer 125. As with all other epoxy or solder layers, the preferred thickness of layer 131 is about 25 µm or greater.

The surface of chip 110 remote from solder layer 131 is covered by an extra metal layer 115 preferably including copper or aluminum. The thickness of layer 115 preferably ranges from about 1 to 15 µm and is selected so that the resistance for a current flowing laterally through the layer area is equal to or less than the resistance for the current, spread over the control chip area, flowing vertically through control FET chip 110. The top surface of layer 115 is bondable so that layer 115 can be connected to input supply terminal $V_{IN}$.

Figure 7E:
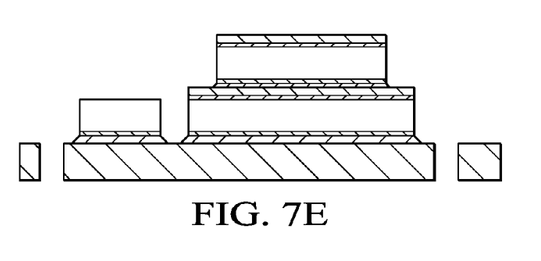
FIG. 7E indicates the process step of concurrently reflowing the solder layers.

When solder paste is employed, thermal energy is supplied in the next process step 704, indicated in FIG. 7E, in order to raise the temperature for reflowing the layers of solder paste at the solder reflow temperature. Since all solder layers are made of the same material, all solder connections are accomplished concurrently by a single reflow step. This simplifying feature contributes significantly to a low cost of the fabrication method.

Figure 7F:
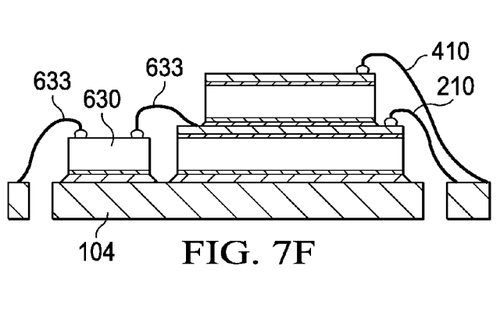
FIG. 7F displays the wire bonding step.

After curing of the epoxy precursors, or after lowering the temperature from the solder reflow temperature, wire bonding or ribbon bonding is employed in process step 705, depicted in FIG. 7F, to connect metal layer 115 to the input terminals $V_{IN}$ (wires 410) and metal layer 125 to the switch node terminals $V_{SW}$ (wires 210). For ball bonds, the preferred wire metal is copper-based with diameters ranging from 20 to 50 µm and balls of about 1.4 wire diameters; the preferred wire diameter is between 35 and 50 µm. The bondability of layers 115 and 125 permits other metal bonds such as stitch bonds, pressure bonds, wedge bonds, and welded bonds. Preferably using the same bonding temperature, the connections 633 are formed for the terminals of the driver-and-control chip 630 to respective leads of the leadframe and to the gate and gate return terminals of the sync FET chip and the gate terminal of the control FET chip. These connections preferably use wires of the same diameter 35 to 50 μm as wires 410 and 210, but diameters thinner than 25 μm are practiced. Bonding step 705 avoids downhill bonding almost completely and thus minimizes the well-known reliability issue of wire shorting during the encapsulation step.

Figure 7G:
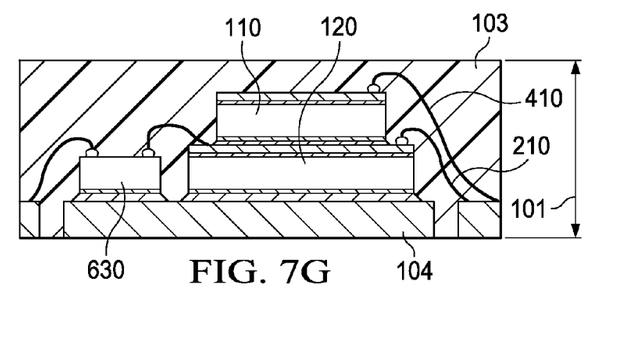
FIG. 7G illustrates the process step of overmolding.

In the next process step 706, illustrated in FIG. 7G, the driver-and-control chip 630, the sync FET chip 120, the control FET chip 110, and all wire bonds are encapsulated in a packaging compound 103. In contrast, the bottom of pad 104 and the bottoms of the leads are left un-encapsulated so that the pad bottom and lead bottom surfaces can be attached to a substrate heat sink. Thickness 101 of the exemplary encapsulated module can be kept between 0.8 and 1.0 mm. Design and process improvements (such as thinner chips and low-rise wire bonds) under development should allow future module thicknesses of about 0.4 mm.

For reasons of batch processing and low fabrication cost, it is preferred to provide the leadframe in strip form. In process step 707, the encapsulated strip is singulated into discrete module units like the module depicted in FIG. 6A. A preferred singulation technique is sawing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors.

As another example, the high current capability of the power supply module can be further extended, and the efficiency further enhanced, by attaching a heat sink to the molded top surface of the module. In this configuration, the hexahedron-shaped module can dissipate its heat from both large surfaces (bottom and top) to heat sinks.

It is therefore intended that the appended claims encompass any such modifications or embodiments.

We claim:

1. A power converter system comprising:
   a QFN leadframe having a flat pad and leads connected to electrical terminals;
   a first FET chip having one power terminal attached to the pad and the opposite power terminal covered by a first metal layer connected to a first lead, the first metal layer providing a smaller resistance to a current between first lead and pad than the resistance through the first chip, thereby enabling the current to spread evenly through the first layer before entering the first chip;
   a second FET chip having one power terminal attached to the first layer and the opposite power terminal covered by a second metal layer connected to a second lead, the second metal layer providing a smaller resistance to a current from the first to the second lead, or from the pad to the second lead, than the resistance through the second chip, thereby enabling the current to spread evenly through the second layer for exiting the first chip; and
   bonding wires connecting the first metal layer to the first lead and the second metal layer to the second lead.

2. The system of claim 1 wherein the first FET chip is a sync chip having source and drain as power terminals on opposing chip sides, and a gate terminal.

3. The system of claim 1 wherein the second FET chip is a control chip having source and drain as power terminals on opposing chip sides, and a gate terminal.

4. The system of claim 1 further including a packaging compound encapsulating the first FET chip, the second FET chip, and the connecting bonding wires.

5. The system of claim 4 wherein the first metal layer and the second metal layer include copper and have a thickness in the range from 1 to 15 μm.

6. The system of claim 4 wherein the first metal layer and the second metal layer include aluminum and have a thickness in the range from 1 to 30 μm.

7. The system of claim 5 wherein the bonding wires include copper and have a diameter in the range from 20 to 50 μm.

8. The system of claim 7 further including a packaging compound encapsulating the sync chip, the control chip, and the bonding wires.

9. The system of claim 8 further including a driver chip positioned adjacent to the assembled first and second FET chips, the driver chip being attached to the pad and connected by bonding wires to the first and second chips and to leads.

10. The system of claim 8 further including a controller chip positioned adjacent to the assembled first and second FET chips, the controller chip being attached to the pad and connected by bonding wires to the first and second chips and to leads.

11. The system of claim 4 wherein the electrical interconnection between the pad and the first chip and between the first chip and the second chip comprises a solder material which is reflowed and contains metals selected from a group including tin, silver, indium, bismuth, copper and lead.

12. The system of claim 4 wherein the electrical interconnection between the pad and the first chip and between the first chip and the second chip comprises an epoxy-based material which is cured and contains electrically conductive filler particles selected from a group including silver and copper.

* * * * *